United States Patent
Kuo et al.

(10) Patent No.: US 11,631,717 B2
(45) Date of Patent: Apr. 18, 2023

(54) 3D MEMORY ARRAY WITH MEMORY CELLS HAVING A 3D SELECTOR AND A STORAGE COMPONENT

(71) Applicant: Intel Corporation, Santa Clara, CA (US)

(72) Inventors: Charles Kuo, Union City, CA (US); Prashant Majhi, San Jose, CA (US); Abhishek Sharma, Hillsboro, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 856 days.

(21) Appl. No.: 16/147,068

(22) Filed: Sep. 28, 2018

(65) Prior Publication Data

US 2020/0105835 A1    Apr. 2, 2020

(51) Int. Cl.
| | | |
|---|---|---|
| *H01L 27/24* | (2006.01) | |
| *G11C 7/18* | (2006.01) | |
| *G11C 8/14* | (2006.01) | |
| *G11C 13/00* | (2006.01) | |
| *H01L 45/00* | (2006.01) | |

(52) U.S. Cl.
CPC ............ *H01L 27/2481* (2013.01); *G11C 7/18* (2013.01); *G11C 8/14* (2013.01); *G11C 13/003* (2013.01); *H01L 27/2409* (2013.01); *H01L 45/1233* (2013.01); *H01L 45/1253* (2013.01); *H01L 45/141* (2013.01)

(58) Field of Classification Search
CPC ............. H01L 27/2481; H01L 27/2409; H01L 45/1233; H01L 45/1253; H01L 45/141; H01L 45/065; H01L 45/1226; H01L 45/144; H01L 27/249; G11C 7/18; G11C 8/14; G11C 13/003; G11C 5/02; G11C 11/401; G11C 13/0004; G11C 16/0483
See application file for complete search history.

(56) References Cited

U.S. PATENT DOCUMENTS

| | | | | |
|---|---|---|---|---|
| 8,178,875 | B2 * | 5/2012 | Kiyotoshi | ........... H01L 27/1021 |
| | | | | 257/41 |
| 8,299,571 | B2 * | 10/2012 | Ozawa | ................ H01L 27/2418 |
| | | | | 257/E29.325 |
| 8,841,649 | B2 * | 9/2014 | Pio | .......................... H01L 45/04 |
| | | | | 257/E45.001 |
| 9,768,234 | B2 * | 9/2017 | Jo | .......................... H01L 45/085 |
| 9,818,801 | B1 | 11/2017 | Rabkin | |
| 9,978,810 | B2 * | 5/2018 | Pellizzer | ............. H01L 27/2481 |
| 2018/0012652 | A1 | 1/2018 | Yang et al. | |
| 2018/0114900 | A1 | 4/2018 | Kamata | |

OTHER PUBLICATIONS

Search Report from European Patent Application No. 19183068.6, dated Mar. 26, 2020, 8 pgs.

(Continued)

*Primary Examiner* — Allison Bernstein
(74) *Attorney, Agent, or Firm* — Schwabe, Williamson & Wyatt, P.C.

(57) ABSTRACT

A memory cell is disclosed. The memory cell includes a storage component that includes a chalcogenide stack that includes a plurality of layers of material and a selector component that includes a Schottky diode.

17 Claims, 9 Drawing Sheets

(56) References Cited

OTHER PUBLICATIONS

An Chen et al: A review of emerging non-volatile memory (NVM) technologies and applications, Solid State Electronics, Elsevier Science Publishers, Barking GB, vol. 125, Nov. 1, 2016 pp. 25-38.
Office Action from European Patent Application No. 19183068.6, dated Jan. 26, 2021, 5 pgs.
Notice of Allowance from European Patent Application No. 19183068.6, dated Dec. 16, 2021, 2 pgs.

* cited by examiner

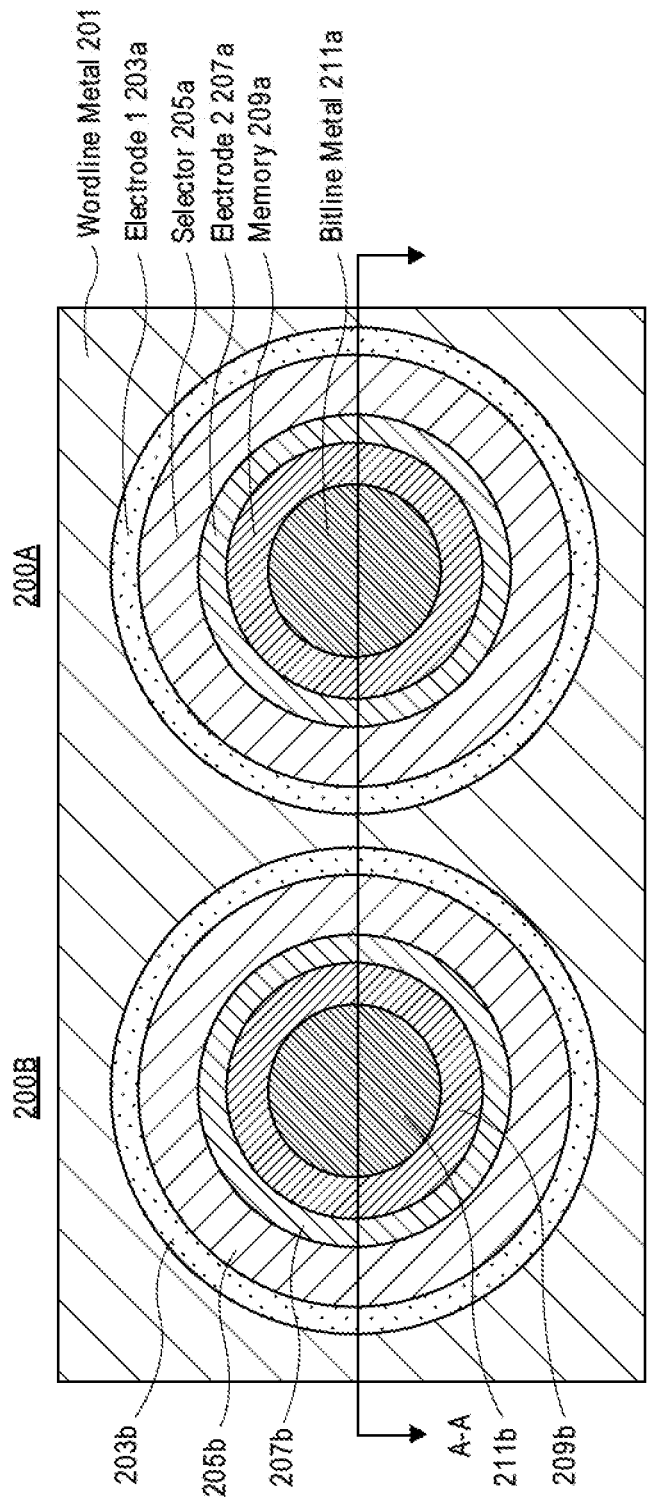
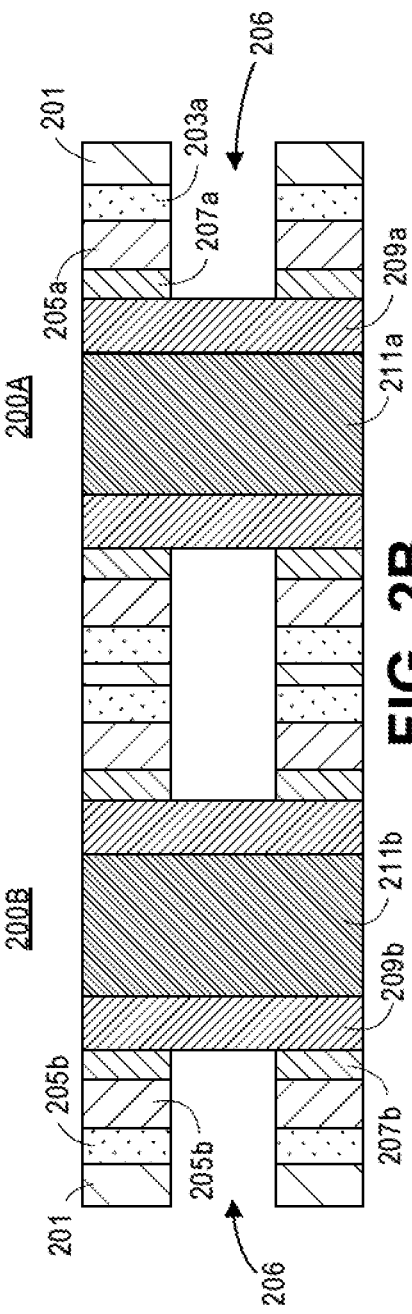
FIG. 2A
FIG. 2B ately obscure embodiments of the present disclosure. Furthermore, it is to be appreciated that the various embodiments shown in the Figures are illustrative representations and are not necessarily drawn to scale.

3D MEMORY ARRAY WITH MEMORY CELLS HAVING A 3D SELECTOR AND A STORAGE COMPONENT

TECHNICAL FIELD

Embodiments of the disclosure pertain to 3D memory arrays and, in particular, to 3D memory arrays with memory cells that include a 3D selector and a storage component.

BACKGROUND

Three dimensional (3D)-stacked dynamic random access memory (DRAM) is an emerging technology where multiple DRAM chips and logic layers are stacked on top of each other, e.g., for high bandwidth memory (HBM), and connected by through silicon vias (TSV). By avoiding input/output (I/O) pin count limitations, dense TSV connections allow high bandwidth and low latency communication within the stack. However, the stacking of multiple chips requires the formation of multiple substrates and TSVs. This layering process leads to higher cost.

3D NAND flash memory can be used to make solid state drives (SSD). 3D NAND flash memory is a type of flash memory in which memory cells are stacked vertically in multiple layers. 3D NAND offers the potential for higher capacity memory in a smaller physical space than 2D NAND. An advantage of 3D NAND is a manufacturing cost that is lower than the manufacturing cost for 2D NAND. The manufacture of 3D NAND memory can take place in the same manufacturing facility as 2D NAND memory. However, the 3D NAND that is produced is slow and requires high voltages.

BRIEF DESCRIPTION OF THE DRAWINGS

FIG. 2A is an illustration of a top cross-sectional view of an adjacent pair of memory cells in an embodiment.

FIG. 2B is an illustration of a front cross-sectional view of an adjacent pair of memory cells in an embodiment.

DESCRIPTION OF THE EMBODIMENTS

Figure 1A:
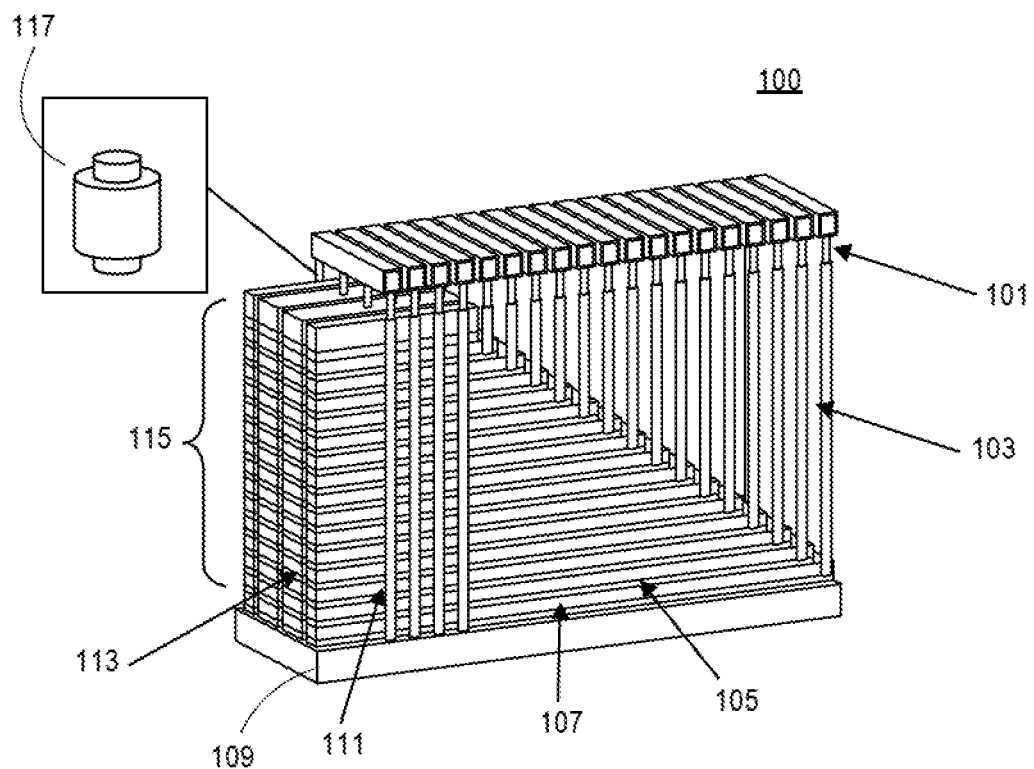
FIG. 1A is an illustration of a three dimensional (3D) memory array that includes a 3D memory cell that is structured according to an embodiment.

Three dimensional (3D) memory arrays with memory cells that have a 3D selector and a storage component are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Some previous approaches to providing dense memory cell sizes for high bandwidth memory (HBM) includes stacking dynamic random access memory (DRAM) chips and using 3D NAND memory arrays. Shortcomings of the previous approaches include the expensive processing that stacking multiple chips requires, including the need to form multiple substrates and through silicon vias (TSVs). In addition, 3D NAND memory arrays are slow and require high voltages. A process and device that overcomes the shortcomings of such approaches is disclosed herein. As part of a disclosed approach, a memory cell structure that includes a chalcogenide-based multi-layer stack and a Schottky diode is used as part of a 3D array. The chalcogenide-based multi-layer stack and Schottky diode provides a unique combination of voltage, speed, and density and performs better than previous memory technologies such as HBM, Optane, and 3D NAND.

FIG. 1A is an illustration of a 3D memory array 100 that includes a 3D memory cell that is structured according to an embodiment. In FIG. 1A the 3D memory array includes bit lines 101, contacts 103, word lines 105, insulating layers 107, substrate 109, pillars 111, slits 113, stacks 115 and individual memory cell 117.

Referring to FIG. 1A, the bit lines 101 are formed at the top of the array structure and are coupled to the pillars 111. The pillars 111 are oriented orthogonally with respect to the substrate 109. The pillars 111 extend through the word line layers 105 that are formed parallel to the substrate 109. The stacks 115 include alternating layers of conductive and insulating material. The conductive layers form the word line layers 105. The insulating layers 107 separate the word line layers 105. The stacks 115 are separated by slits 113.

Figure 1B:
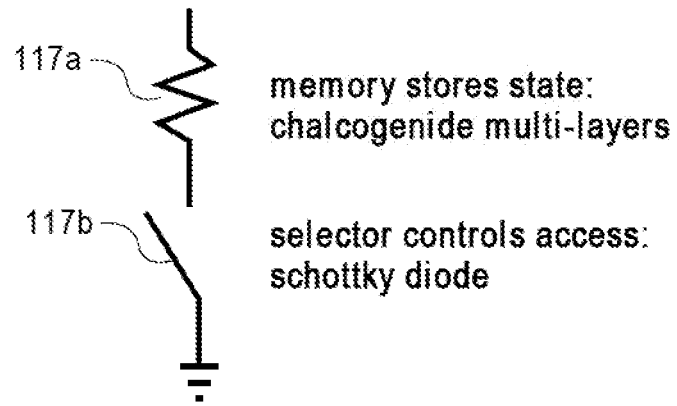
FIG. 1B is an illustration of a low voltage memory cell according to an embodiment.

The individual memory cells 117 are formed at the intersections of the pillars 111 and the word line layers 105. FIG. 1B is a schematic showing the components of the individual memory cells 117 according to an embodiment. Referring to FIG. 1B, the memory cells 117 can include a resistor 117a and a diode 117b (shown as a switch). In an embodiment, the resistor 117a stores the memory cell logic states and the diode 117b controls access to the stored logic states. In an embodiment, when a memory cell is addressed the diode 117b selector is caused to conduct such that the contents of the memory cell can be accessed. In addition, when the memory cell has not been addressed, the diode 117b is reversed bias and blocks sneak current such that sneak current paths are prevented in the memory array. In an embodiment, the resistor 117a can include a chalcogenide multi layered stack. In other embodiments, the resistor 117a can include other materials. In an embodiment, the material makeup of the multi layered stack can include but is not limited to GeTe/Sb2Te3, Ge30Te70/Sb2Te3 and GeTe/Sb. In other embodiments, other materials and stack arrangements can be used, such other materials can include but are not limited to Ge/Sb.

In an embodiment, the chalcogenide multi-layer implementations operate with low voltage and currents at fast speeds. Thus, chalcogenide multi-layer implementations are suitable for HBM in addition to phase change memories in high capacity and speed applications. Long-term retention can also be traded off for HBM, since periodic refreshes are permitted for near-memory applications.

In an embodiment, the switching mechanism of chalcogenide multi-layer implementations requires less energy than conventional melt/recrystallization/amorphization that is used in conventional phase change memories with homogenous materials like Ge2Sb2Te5.

Figure 1C:
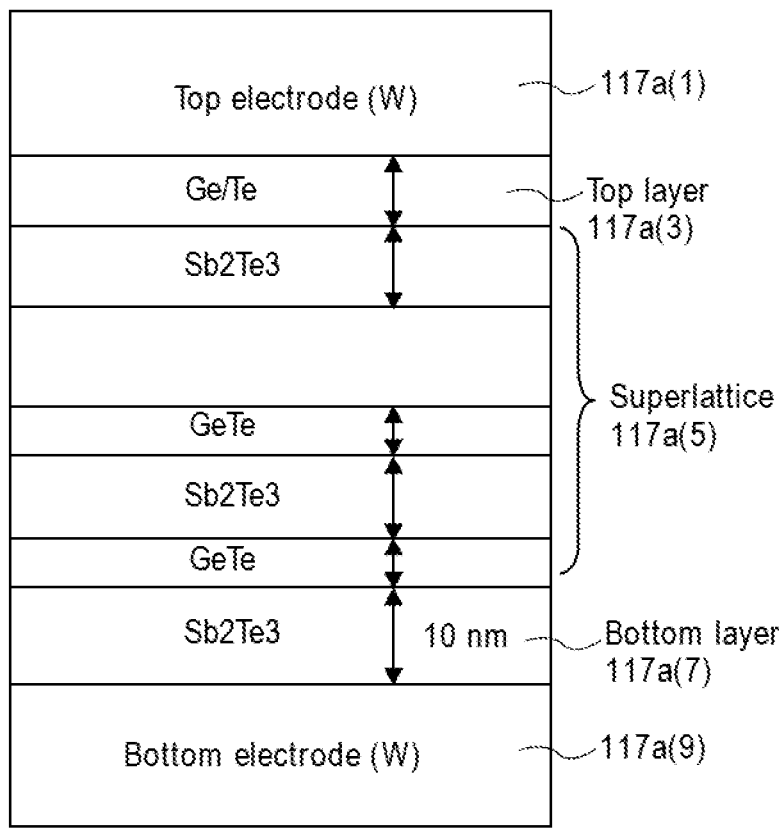
FIG. 1C is an example chalcogenide stack of a resistor according to an embodiment.

FIG. 1C is an example chalcogenide stack of resistor 117a according to an embodiment. In the FIG. 1C example, chalcogenide stack includes top electrode 117a(1), top layer 117a(3), superlattice 117a(5), bottom layer 117a(7), and bottom electrode 117a(9). Referring to FIG. 1C, the top electrode 117a(1) is formed above the top layer 117a(3). The superlattice 117a(5) is formed above the bottom layer 117a(7). The bottom layer 117a(7) is formed above the bottom electrode 117a(9). In an embodiment, the top electrode 117a(1) is formed from W. In other embodiments, the top electrode 117a(1) can be formed from other materials. In an embodiment, the top layer 117a(3) can be formed from GeTe. In other embodiments, the top layer 117a(3) can be formed from other materials. In an embodiment, the superlattice 117a(5) can be formed from alternating layers of Sb2Te3 and GeTe. In other embodiments, the superlattice 117a(5) can be formed from alternating layers of other materials. In an embodiment, the bottom layer 117a(7) can be formed from Sb2Te3. In other embodiments, the bottom layer 117a(7) can be formed from other materials. In an embodiment, bottom layer 117a(7) can have a length of 10 nm. In other embodiments, bottom layer 117a(7) can have any other suitable length. In an embodiment, the bottom electrode 117a(9) is formed from W. In other embodiments, the bottom electrode 117a(9) can be formed from other materials.

Referring to FIG. 1B, in an embodiment, the diode 117b can include a Schottky diode. In other embodiments, the diode 117b can include other types of diodes. In an embodiment, the diode 117b functions as a low-voltage, fast selector mechanism. In an embodiment, the material structure of the diode 117b can include a semiconducting oxide with a Schottky interface on one side and an ohmic interface on the other. In an embodiment, Schottky diodes can be implemented as the selector in a straightforward manner. In other embodiments, the selector can be implemented using a P/N diode that is formed from semiconducting oxides. In still other embodiments, the selector can be implemented using a P/N diode that is formed from other materials.

Figure 1D:
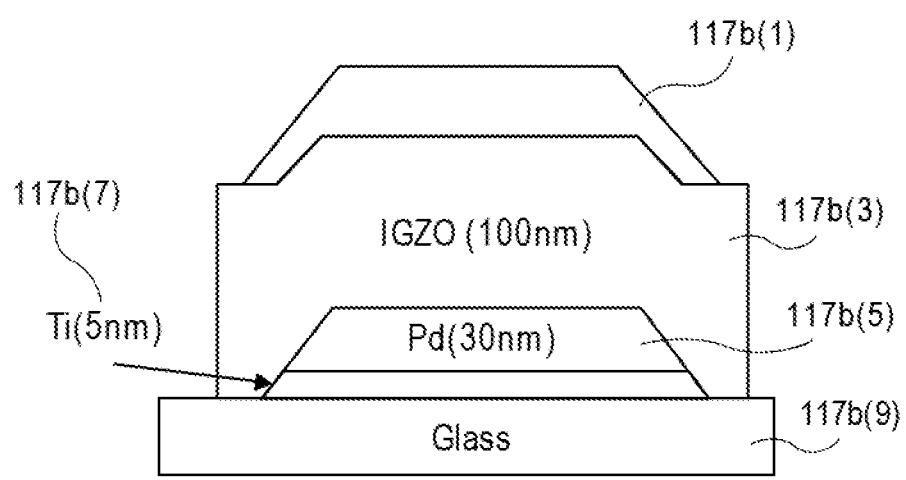
FIG. 1D is an illustration of the material structure of a Schottky diode according to an embodiment.

FIG. 1D is an illustration of an example material configuration of the Schottky diode 117b according to an embodiment. In the FIG. 1D example, Schottky diode 117b includes molybdenum 117b(1), IGZO 117b(3), palladium 117b(5), titanium 117b(7) and glass 117b(9). In an embodiment, the Pd/IGZO interface is a Schottky interface, while the Mo/IGZO interface is an ohmic interface. In an embodiment, the Schottky electrode can include metal having a lower metal workfunction than molybdenum, which can improve ON-current density. In an embodiment, metals with lower workfunctions can include but are not limited to TiN or W. In an embodiment, the IGZO 117b(3), the palladium 117b(5) and the titanium 117b(7) can have the lengths shown in FIG. 1D. In other embodiments, the IGZO 117b(3), the palladium 117b(5) and the titanium 117b(7) can have other lengths. Fermi level pinning can be mitigated, through either the formation of sufficient oxygen concentrations at the Schottky interface or by separately introducing a thin conductive oxide to passivate defects within the semiconducting bandgap.

Referring again to FIG. 1A, in an embodiment the bit lines 101 can be formed from tungsten. In other embodiments, the bit lines 101 can be formed from other materials. In an embodiment, the contacts 103 can be formed from tungsten. In other embodiments, the contacts 103 can be formed from other materials. In an embodiment, the word lines 105 can be formed from tungsten in other embodiments, the word lines 105 can be formed from other materials. In an embodiment, the insulating layers 107 can be formed from an oxide. In other embodiments, the insulating layers 107 can be formed from other materials. In an embodiment, the substrate 109 can be formed from materials that include silicon and gallium nitride. In other embodiments, the substrate 109 can be formed from other materials. In an embodiment, the pillars 111 can be formed from tungsten. In other embodiments, the pillars 111 can be formed from other materials.

In operation, memory cells can be accessed by applying appropriate voltage levels to the word lines and the bit lines associated with the memory cell that is being accessed. As part of a disclosed approach, the accessed memory cell can include a chalcogenide-based multi-layered memory device for memory storage and a Schottky diode that controls access. In an embodiment, the chalcogenide-based multi-layer stack plus Schottky diode provides a unique combination of low voltage, speed, density which exceeds the performance of previous memory technologies such as HBM, other high capacity and speed technologies, and 3D NAND. The performance advantages are provided without the need to stack multiple chips, use expensive processing, or multiple substrates and TSVs.

FIGS. 2A and 2B are illustrations of cross-sectional views of an adjacent pair of memory cells 200A and 200B in an embodiment. FIGS. 2A and 2B show cross-sections of the type of selector and memory components that can be used to form tiers of memory cells that include the selector and memory components. FIG. 2A shows a top cross-sectional view of adjacent memory cells 200A and 200B, and FIG. 2B shows a front cross-sectional view of the adjacent memory cells 200A and 200B along line A-A of FIG. 2A. In the FIG. 2A embodiment, the memory cell 200A includes first electrode 203a, selector 205a, second electrode 207a, memory 209a and bit line conductor 211a. In addition, the memory cell 200B includes first electrode 203b, selector 205b, second electrode 207b, memory 209b and bit line conductor 211b. The word line conductor 201 is the same for the memory cell 200A and the memory cell 200B.

Referring to FIG. 2A, in an embodiment, the word line conductor 201 surrounds the materials that are a part of the stack of materials that form the memory cell 200A and the memory cell 200B. Moreover, the materials that are used to form the memory cell 200A and the memory cell 200B are formed as concentric layers of material. For example, with regard to memory cell 200A, the first electrode 203a surrounds the selector 205a, the selector 205a surrounds the second electrode 207a, the second electrode 207a surrounds the memory 209a, and the memory 209a surrounds the bit line conductor 211a. Similarly, with regard to the memory cell 200B, the first electrode 203b surrounds the selector 205b, the selector 205b surrounds the second electrode 207b, the second electrode 207b surrounds the memory 209b and the memory 209b surrounds the bit line conductor 211b.

Referring to FIG. 2B, the bit line conductors 211a and 211b and the memory 209a and 209b extend the full length of the memory cells 200A and 200B respectively. The word line 201, the first electrodes 203a and 203b, the selectors 205a and 205b and the second electrodes 207a and 207b are interrupted by space 206. In an embodiment, the memory cell 200A and the memory cell 200B can be addressed by the application of predetermined voltages to the word line and the bit line that is associated with the memory cell. For example, to address memory cell 200A, predetermined voltages are applied to the word line conductor 201 and the bit line conductor 211a that is associated with memory cell 200A. The voltages cause the selector 205a to conduct such that the memory 209a can be accessed. Similarly, to address memory cell 200B predetermined voltages are applied to the word line conductor 201 and the bit line conductor 211b that is associated with memory cell 200B. These voltages cause the selector 205b to conduct such that the memory 209b can be accessed.

Figure 3:
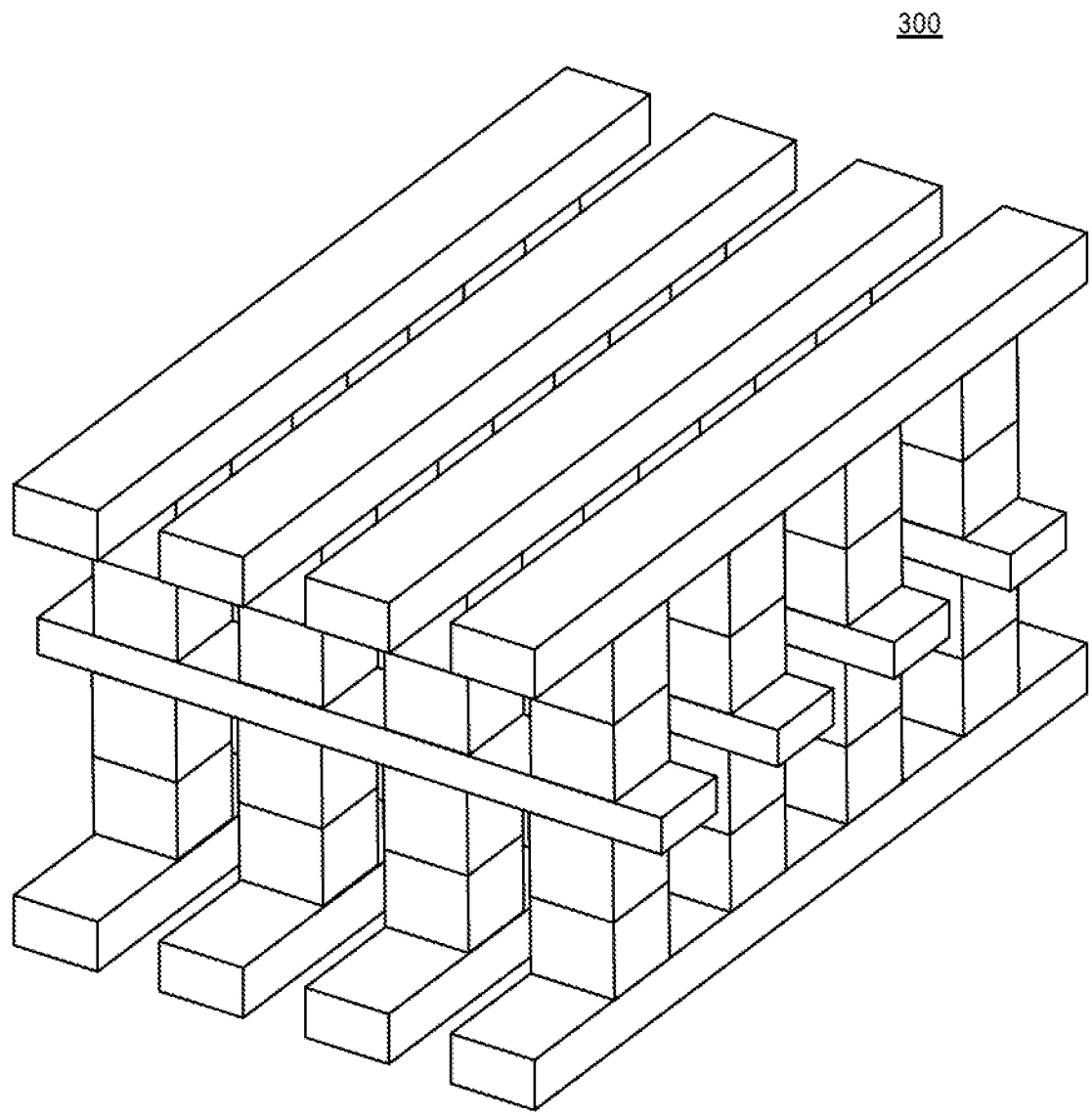
FIG. 3 shows a 3D crosspoint implementation in accordance with an embodiment.

FIG. 3 shows a 3D crosspoint array 300 implementation in accordance with an embodiment. In an embodiment, the cell deselect mechanism for the 3D crosspoint array 300 of FIG. 3D, can be different from the cell deselect mechanism of the 3D stacked array 100 of FIG. 1A. For example, the memory cell deselect voltage for memory cell in the 3D stacked array 100 embodiment of FIG. 1A can be −V. In contrast, the memory cell deselect voltage for the crosspoint array 300 can be V/2. In other embodiments, the 3D stacked array 100 and the crosspoint array 300 can have other deselect voltages. The memory cell deselect voltage for crosspoint array 300 results from the bidirectional character of the selector. A faster speed and lower voltage makes the 3D crosspoint array 300 example suitable for high bandwidth memory (HBM) applications.

Figure 4:
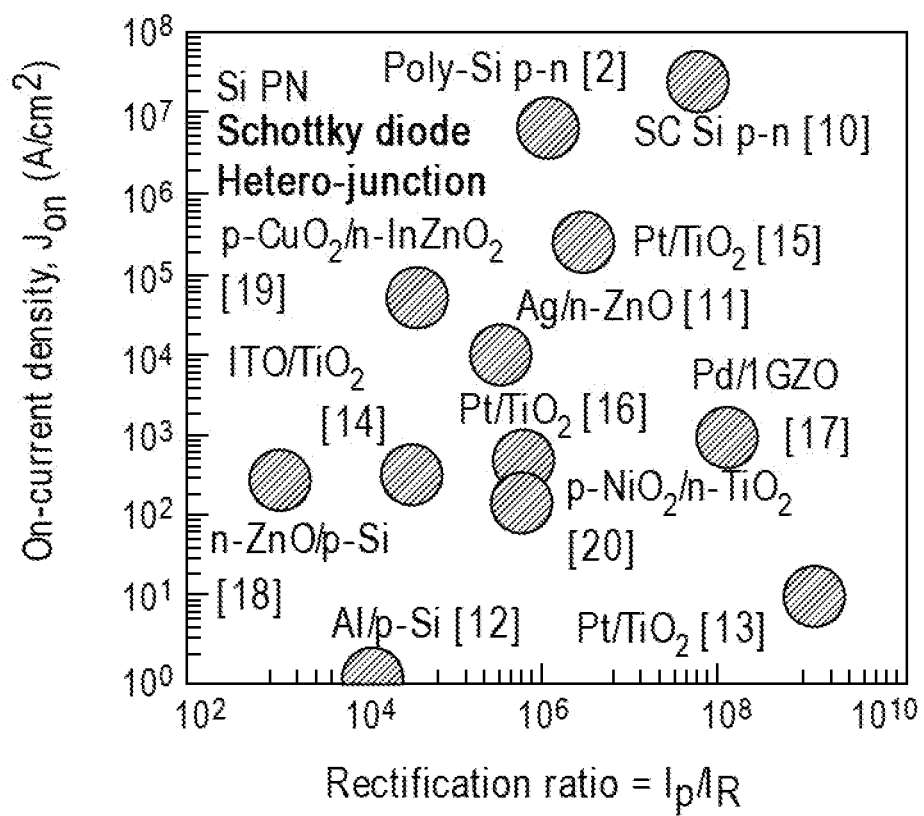
FIG. 4 is a graph of rectification ratio versus on current density of various materials.

FIG. 4 is a graph of rectification ratio versus on current density of various materials. FIG. 4 shows material that has both favorable rectification ratio and on current density, material that has both unfavorable rectification ratio and on current ratio, material that has mediocre rectification ratio and on current density, material that has favorable rectification ratio and unfavorable on current density and material that has unfavorable rectification ratio and favorable on current density. Referring to FIG. 4, SCSi p-n junctions have both favorable rectification ratio and current density. Pt and TiO2 Schottky diodes have favorable rectification ratio and unfavorable on current density, and Ag and n-ZnO Schottky diodes have relatively mediocre rectification ratio and mediocre on-current density. Pd and IGZO Schottky diodes reportedly provide favorable rectification ratio, but work to achieve higher on-current density is ongoing.

Figure 5:
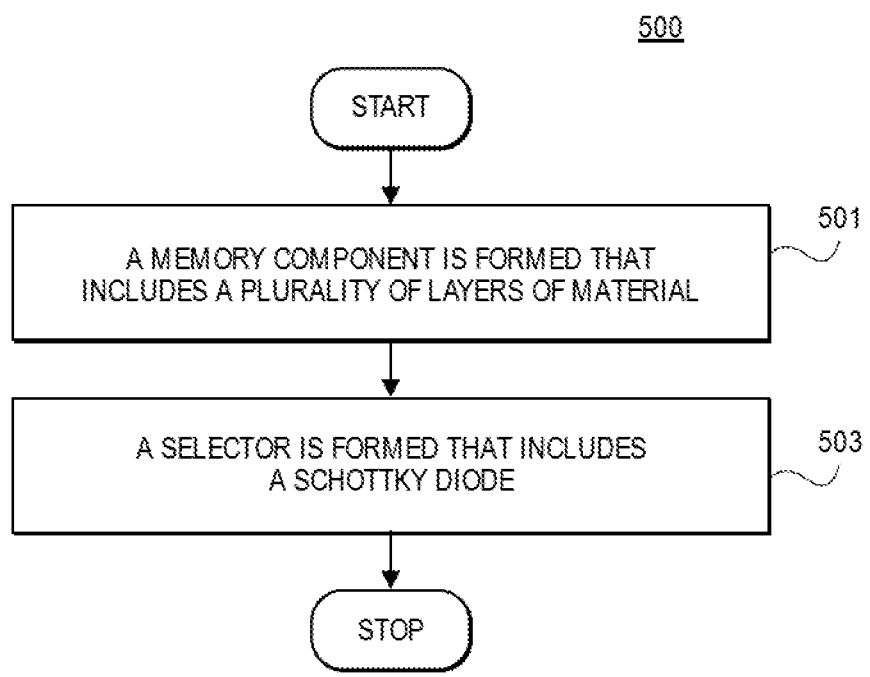
FIG. 5 is a flowchart of a method for forming a 3D memory array that includes a 3D memory cell according to an embodiment.

FIG. 5 is a flowchart of a method for forming a 3D memory array that includes a 3D memory cell that is structured according to an embodiment. Referring to FIG. 5, at 501 a memory component is formed that includes a chalcogenide stack that includes a plurality of layers of material. At 503, a selector component is formed that includes a Schottky diode. In an embodiment, the chalcogenide stack includes a superlattice structure. In an embodiment, the memory cell includes a first electrode surrounding the selector component. In an embodiment, the memory cell includes a second electrode surrounded by the selector component. In an embodiment, the second electrode surrounds the storage component. In an embodiment, the storage component surrounds a bit line conductor. In an embodiment, the Schottky diode includes a Pd-IGZO Schottky interface. In other embodiments, the diode can include other types of interfaces.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 6:
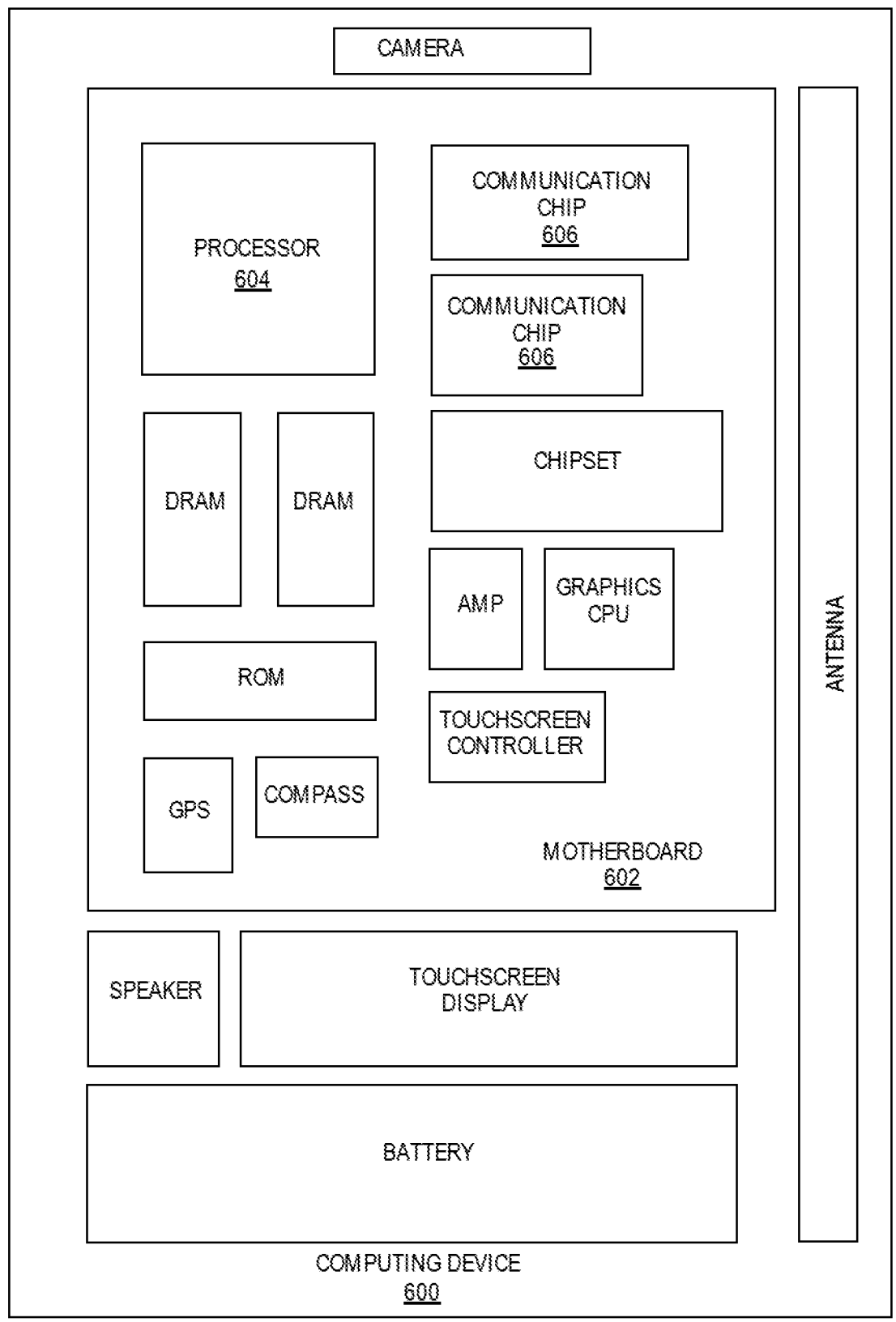
FIG. 6 illustrates a computing device in accordance with one implementation of an embodiment.

FIG. 6 illustrates a computing device 600 in accordance with one implementation of an embodiment. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as MOS-FET transistors built in accordance with implementations of the invention.

In further implementations, another component housed within the computing device 600 may contain an integrated circuit die that includes one or more devices, such as MOS-FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
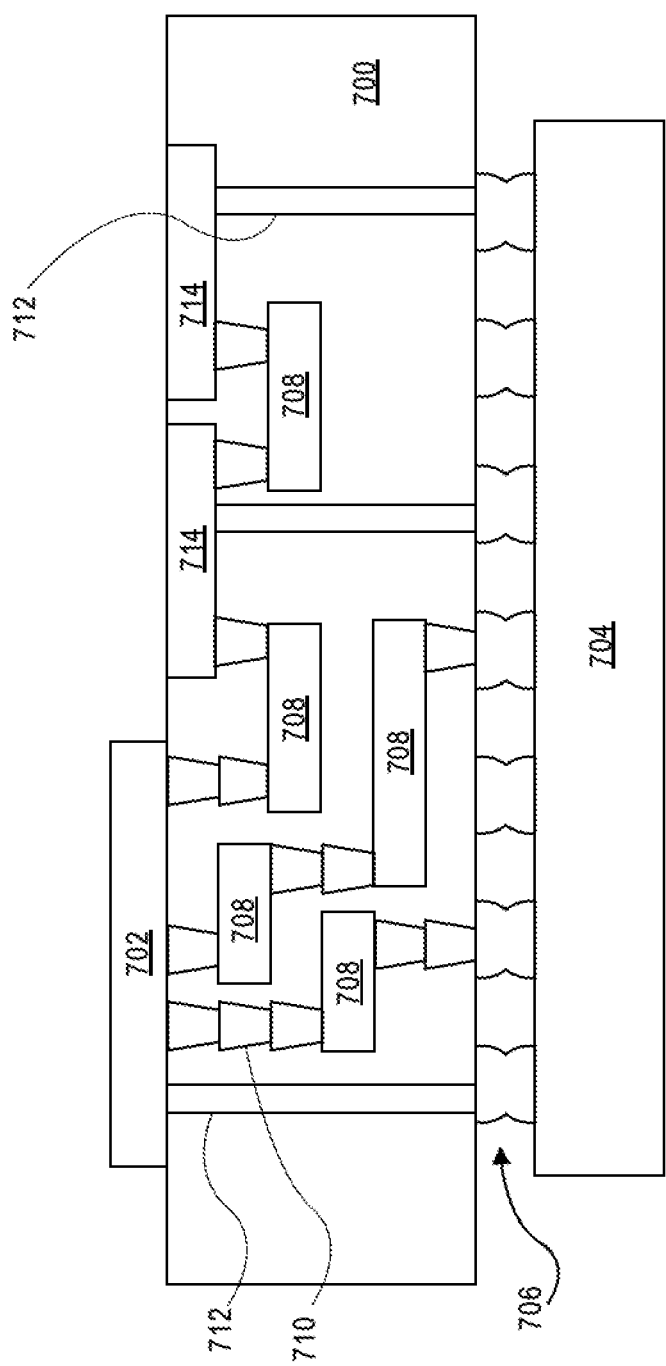
FIG. 7 illustrates an interposer that includes one or more embodiments.

FIG. 7 illustrates an interposer 700 that includes one or more embodiments. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer 700 may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the invention, apparatuses or processes disclosed herein may be used in the fabrication of interposer 700.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: A memory cell includes a storage component that includes a chalcogenide stack that includes a plurality of layers of material and a selector component that includes a Schottky diode.

Example embodiment 2: The memory cell of example embodiment 1, wherein the chalcogenide stack includes a superlattice structure.

Example embodiment 3: The memory cell of example embodiment 1, further comprising a first electrode surrounding the selector component.

Example embodiment 4: The memory cell of example embodiment 1, further comprising a second electrode surrounded by the selector component.

Example embodiment 5: The memory cell of example embodiment 4, wherein the second electrode surrounds the storage component.

Example embodiment 6: The memory cell of example embodiment 1, wherein the storage component surrounds a bit line conductor.

Example embodiment 7: The memory cell of example embodiments 1, 2, 3, 4, 5, and 6 wherein the Schottky diode includes a Pd-IGZO Schottky interface.

Example embodiment 8: A memory cell array includes a plurality of word lines, a plurality of bit lines and a plurality of memory cells coupled at intersections of the plurality of word lines and the plurality of bit lines. The memory cells include a storage component that includes a chalcogenide stack that includes a plurality of layers of material and a selector component that includes a Schottky diode.

Example embodiment 9: The memory cell array of example embodiment 8, wherein the chalcogenide stack includes a superlattice structure.

Example embodiment 10: The memory cell array of example embodiment 8, further comprising a first electrode surrounding the selector component.

Example embodiment 11: The memory cell array of example embodiment 8, further comprising a second electrode surrounded by the selector component.

Example embodiment 12: The memory cell array of example embodiment 11, wherein the second electrode surrounds the storage component.

Example embodiment 13: The memory cell array of example embodiment 8, wherein the storage component surrounds a bit line conductor.

Example embodiment 14: The memory cell array of claims 8, 9, 10, 11, 12 and 13 wherein the Schottky diode includes a Pd-IGZO Schottky interface.

Example embodiment 15: A method includes forming a storage component that includes a chalcogenide stack that includes a plurality of layers of material and forming a selector component that includes a Schottky diode.

Example embodiment 16: The method of example embodiment 15, wherein the chalcogenide stack includes a superlattice structure.

Example embodiment 17: The method of example embodiment 15, further comprising a first electrode surrounding the selector component.

Example embodiment 18: The method of example embodiment 15, further comprising a second electrode surrounded by the selector component.

Example embodiment 19: The method of example embodiment 18, wherein the second electrode surrounds the memory component.

Example embodiment 20: The method of example embodiment 15, 16, 17, 18 and 19 wherein the memory component surrounds a bit line conductor.

What is claimed is:

1. A memory cell, comprising:
   a storage component that includes a chalcogenide stack that includes a plurality of layers of material;
   a selector component that includes a Schottky diode, wherein the selector component laterally surrounds the storage component; and
   a conductive electrode between the selector component and the storage component, wherein the conductive electrode completely laterally separates the selector component from the storage component, and wherein the conductive electrode extends along less than an entirety of a vertical length of the storage component.

2. The memory cell of claim 1, wherein the chalcogenide stack includes a superlattice structure.

3. The memory cell of claim 1, further comprising a second electrode surrounding the selector component.

4. The memory cell of claim 1, wherein the conductive electrode surrounds the storage component.

5. The memory cell of claim 1, wherein the storage component surrounds a bit line conductor.

6. The memory cell of claim 1, wherein the Schottky diode includes a Pd-IGZO Schottky interface.

7. A memory cell array, comprising:
   a plurality of word lines;
   a plurality of bit lines; and
   a plurality of memory cells coupled at intersections of the plurality of word lines and the plurality of bit lines, comprising:
   a memory component that includes a chalcogenide stack that includes a plurality of layers of material;
   a selector component that includes a Schottky diode, wherein the selector component laterally surrounds the memory component; and
   a conductive electrode between the selector component and the memory component, wherein the conductive electrode completely laterally separates the selector component from the memory component, and wherein the conductive electrode extends along less than an entirety of a vertical length of the storage component.

8. The memory cell array of claim 7, wherein the chalcogenide stack includes a superlattice structure.

9. The memory cell array of claim 7, further comprising a second electrode surrounding the selector component.

10. The memory cell array of claim 7, wherein the conductive electrode surrounds the memory component.

11. The memory cell array of claim 7, wherein the memory component surrounds a bit line conductor.

12. The memory cell array of claim 7, wherein the Schottky diode includes a Pd-IGZO Schottky interface.

13. A method, comprising:
   forming a memory component that includes a chalcogenide stack that includes a plurality of layers of material;
   forming a conductive electrode around the memory component; and
   forming a selector component that includes a Schottky diode, wherein the selector component laterally surrounds the memory component, and wherein the conductive electrode completely laterally separates the selector component from the memory component, and wherein the conductive electrode extends along less than an entirety of a vertical length of the storage component.

14. The method of claim 13, wherein the chalcogenide stack includes a superlattice structure.

15. The method of claim 13, further comprising a second electrode surrounding the selector component.

16. The method of claim 13, wherein the conductive electrode surrounds the memory component.

17. The method of claim 13, wherein the memory component surrounds a bit line conductor.

* * * * *